United States Patent [19]

Hull

[11] 4,425,869

[45] Jan. 17, 1984

[54] FLUID FLOW CONTROL MECHANISM FOR CIRCUIT BOARD PROCESSING APPARATUS

[75] Inventor: J. Richard Hull, Chandler, Ariz.

[73] Assignee: Advanced Systems Incorporated, Phoenix, Ariz.

[21] Appl. No.: 415,390

[22] Filed: Sep. 7, 1982

[51] Int. Cl.³ ............................................. B05C 5/02
[52] U.S. Cl. .................................. 118/314; 118/316; 118/325; 134/64 R
[58] Field of Search ............... 118/313, 314, 315, 325, 118/316; 134/64 R, 64 P, 122 R, 122 P; 354/300, 325; 198/624; 226/88

[56] References Cited

U.S. PATENT DOCUMENTS

| | | | |
|---|---|---|---|
| 2,476,097 | 7/1949 | Kagen et al. | 118/221 |
| 2,701,049 | 2/1955 | Kendall et al. | 198/127 |
| 3,082,774 | 3/1963 | Benton et al. | 134/63 |
| 3,448,720 | 6/1969 | Graham | 118/314 X |

Primary Examiner—John P. McIntosh
Attorney, Agent, or Firm—Drummond & Nissle

[57] ABSTRACT

Apparatus for directing a stream of fluid against a pliant substrate panel traveling through the apparatus, the panel including a pair of opposed generally parallel planar surfaces co-terminating at the edge defining the periphery of the panel.

1 Claim, 9 Drawing Figures

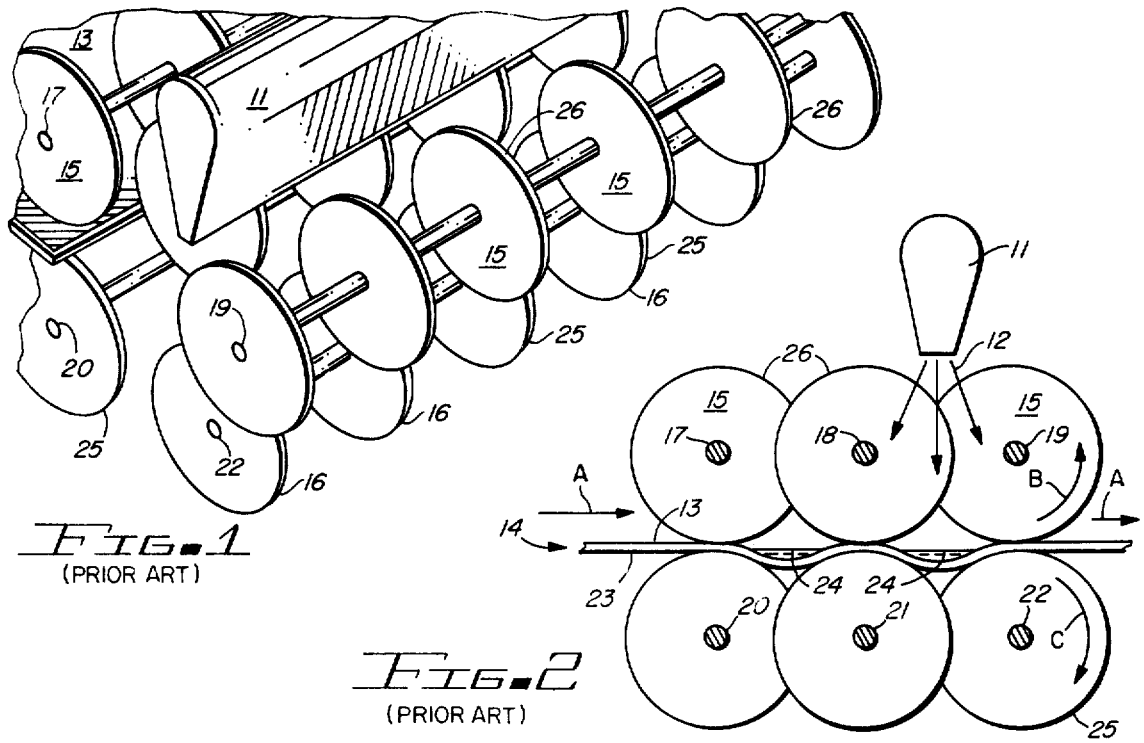
Fig. 1 (PRIOR ART)
Fig. 2 (PRIOR ART)
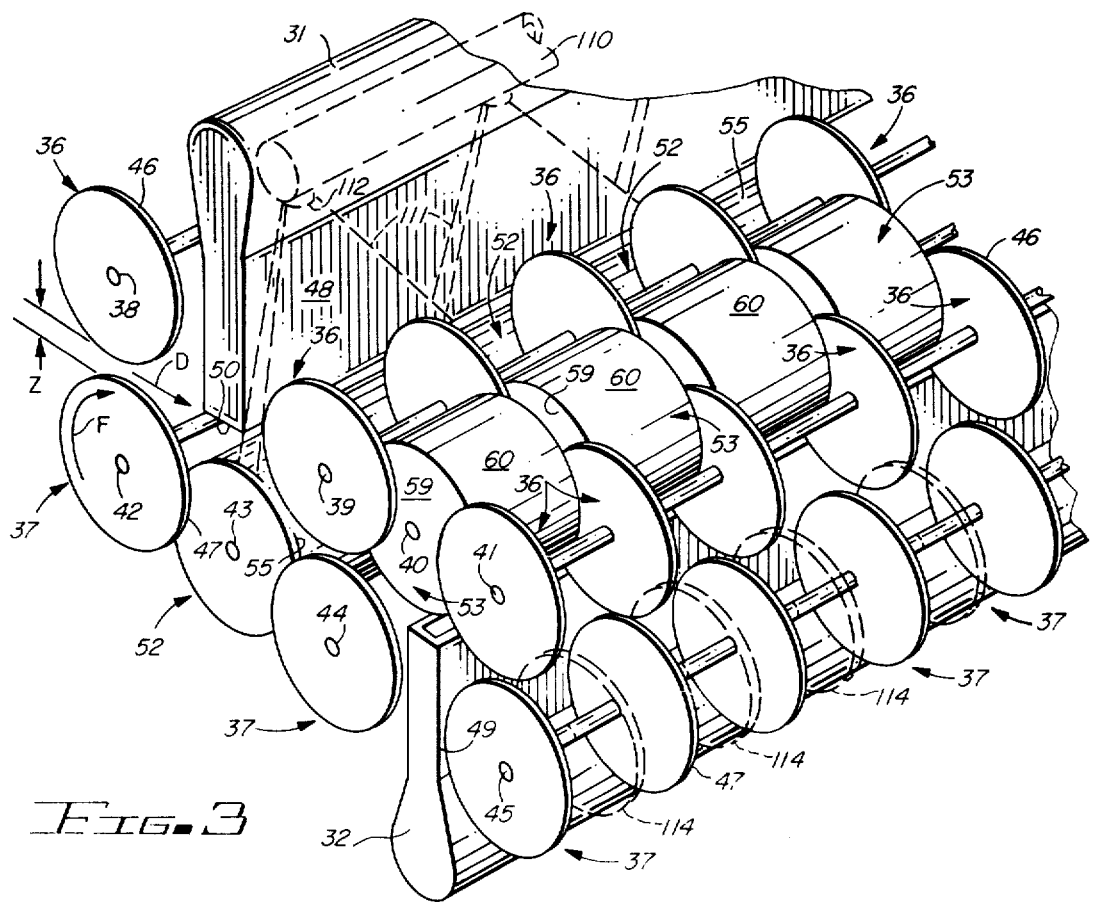
Fig. 3

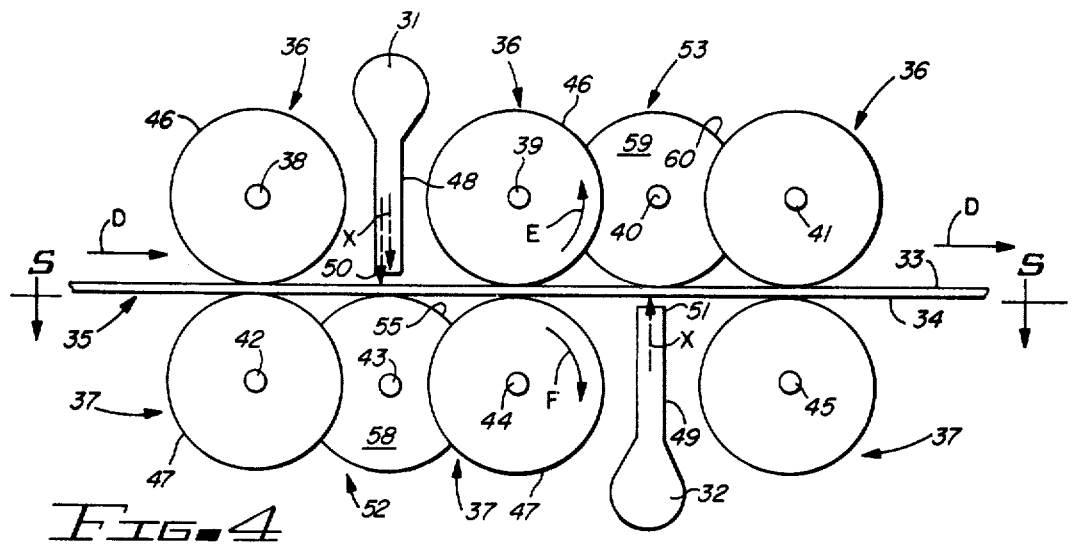
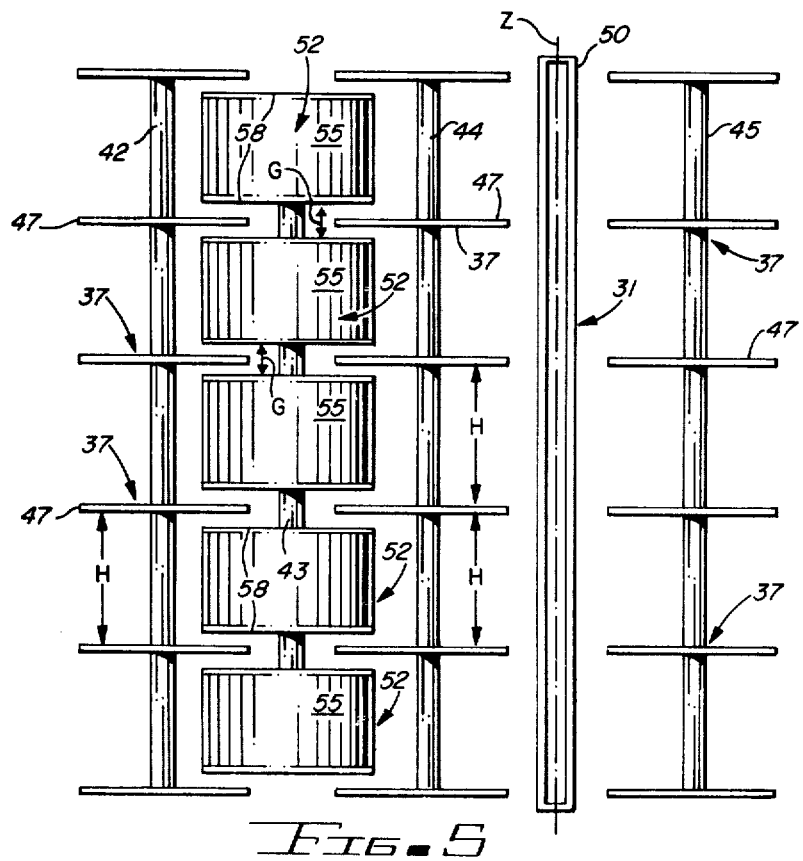

U.S. Patent Jan. 17, 1984 Sheet 3 of 3 4,425,869
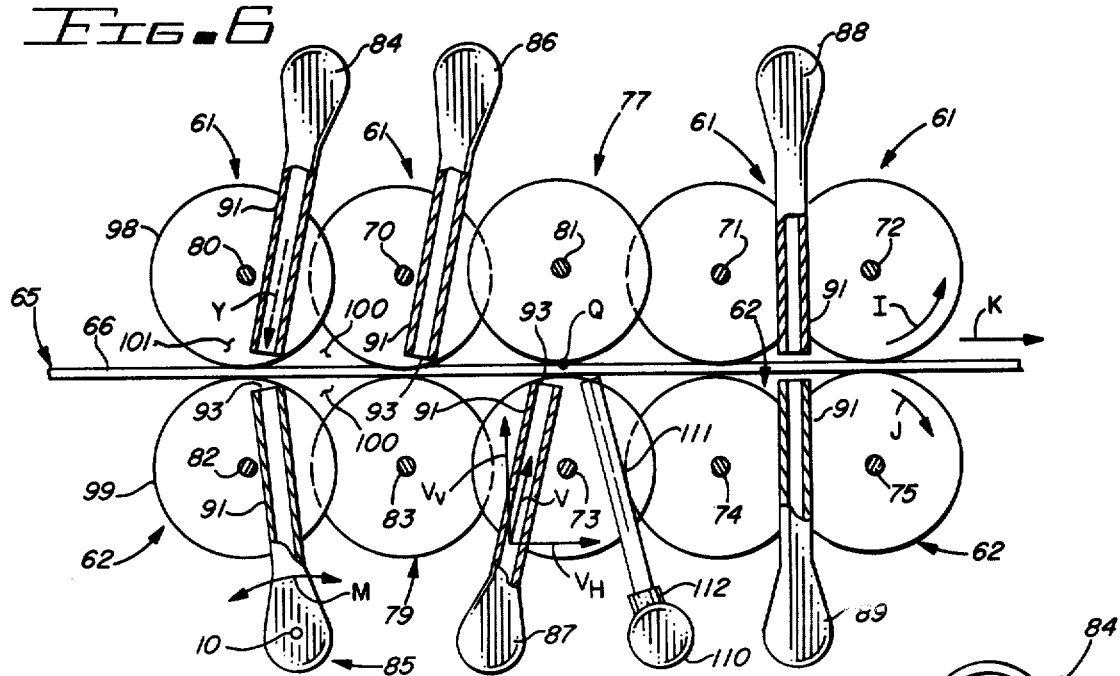
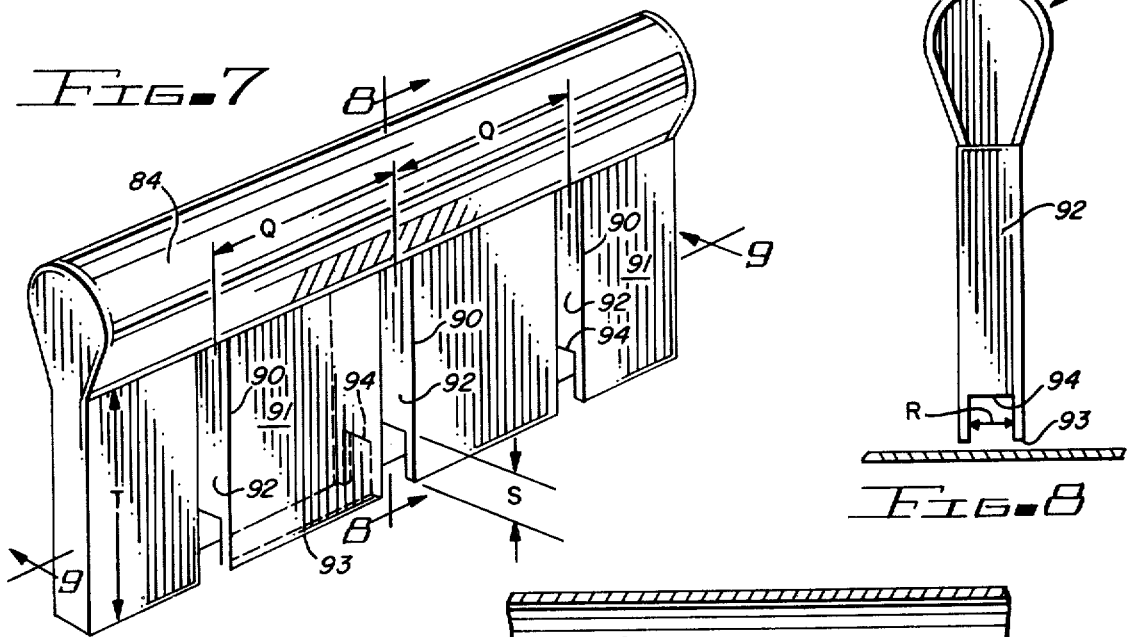
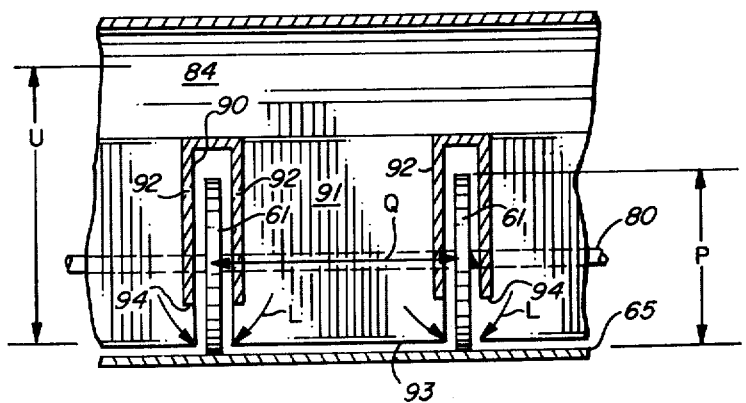

FLUID FLOW CONTROL MECHANISM FOR CIRCUIT BOARD PROCESSING APPARATUS

This invention relates to apparatus for processing printed circuit board substrate.

More particularly, the invention concerns apparatus for contacting a thin, pliant circuit board substrate with pressurized streams of fluid to form a coating on the substrate, the apparatus forming a coating of uniform thickness over the surface of the substrate and minimizing the tendency of the substrate to distend, flutter or wrinkle during processing by the apparatus.

In still another respect, the invention pertains to apparatus for contacting a thin, pliant circuit board substrate with pressurized streams of fluid, the apparatus including a conveyor table comprised of interdigitized, staggered rotating disks for receiving and transporting the circuit board substrate while the substrate is being contacted with pressurized streams of fluid.

Involute apparatus for spraying rectilinear circuit board substrate material is well known in the art. See, for example, U.S. Pat. No. 3,082,774 to Benton, et al. In Benton a conveyor system moves panels of circuit board material past units which direct spray against the upper and lower planar surfaces of the panels.

The conveyor system includes a series of parallel, spaced rotating axles each fixedly carrying a plurality of vertically disposed isodiametric spaced disks. As shown in FIG. 3 of Benton, the intercatenated disks of one syndetic axle are staggered in relation to the disks on immediately adjacent axles in the same manner that adjacent rows of seats in a movie theater are staggered. The spaced disks on one axle do not extend past an imaginary line tangential to the periphery of the disks on an adjacent syndetic axle and, therefore, do not extend into the interstices between the disks carried by the adjacent axle. In other words, the disks on one axle do not intermesh with the disks on adjacent axles.

The Benton apparatus can successfully process renitent circuit board substrate. However, if paper thin, pliant circuit board substrate were placed on the Benton conveyor table, the leading edge of the substrate, i.e., the edge perpendicular to the direction of travel of the substrate over the conveyor table, would tend to move downwardly between two adjacent rows of disks, each row of disks being carried by one of two parallel adjacent axles, and would tend to move off of the conveyor table. In order to prevent this from occurring, the disjunct disks on adjacent disk axles must be interproximated as shown in FIG. 2 of U.S. Pat. No. 2,701,049 to Kendall, et al. If the rotary disks carrying the pliable circuit board substrate are interproximated, when the disks on one rotating axle tend to carry the leading edge of the substrate in the downward direction of travel followed by a point on the periphery of one of the disks, the rotating peripheral moving edges of the disks on the next successive adjacent axle "catch" the leading edge of the pliable substrate and carry it back up to the imaginary horizontal plane tangential to the peripheral edges of the disks. When the disks on one rotating axle intermesh with disks on adjacent axles, the leading edge of pliant circuit board substrate cannot move downwardly between two adjacent rows of disks, each row of disks being carried on one syndetic axle.

While thin, pliant circuit board substrate material is being carried over a group of parallelably vertically disposed rotating disks carried on parallel axles having their axes perpendicular to the rectilinear travel of the substrate material, it is desirable to have a second group of opposing rotating disks and axles positioned just above the tangential conveyor surface defined by peripheral edges of the first or lower group of rotating disks. The center points of the rotary disks and the horizontal center lines of the disk-carrying axles of the first lower group lie in a first plane. The center points of the rotary disks and the horizontal center lines of the axles of the second group lie in a second plane. The first and second planes are parallel. In this intertesselation each of the disks in the lower group has an associated opposing disk in the upper group which is positioned or stacked directly above the lying in the same vertical plane as the opposing lower disk. Each associated stacked pair of disks is positioned so there is a small gap at the point at which their rotating peripheral edges have the closest approach to one another. The gap may be sized so that each pair of stacked disks slightly grasps and pulls substrate material through the disk pair.

In prior art apparatus, when pliable circuit board substrate is traveling between juxtaposed lower and upper opposing groups of rotating disks, spray units positioned subadjacent the lower group of interspaced disks and positioned superadjacent the upper group of interdigitized disks direct divaricating spray streams between the interfluvial disks and against the upper and lower planar surfaces of the circuit board substrate. After the interfluent liquid spray streams contact the rectilinear substrate, the upper and lower surfaces of the substrate are dried by interfluent air streams directed through the interstices between the parallelably disposed interpellant disks and against the upper and lower surfaces of the substrate. This prior art spraying and drying apparatus tends to be, for several reasons, inutile when processing thin, pliant circuit board substrates. First, the spray is normally applied against a length of substrate which spans two or more rotary disks. Since the conveyor surface defined by the isodiametric disks is not perfectly flat, the force of the fluid streams emitted by spray units positioned above the circuit board substrate deflects short lengths of substrate downwardly into hollows defined by the declivities of the edges of disks carried on two adjacent parallel axles positioned beneath the substrate. Fluid tends to accumulate and puddle in these hollows, causing a non-uniform upper coating to form on the substrate. Second, the superincumbent vertiginous disks interdict fluid streams directed from spray units positioned above and below the circuit board substrate so that at any given instant in time a strigose pattern tends to be formed on the upper and lower planar substrate surfaces, resulting in coatings having non-uniform thickness at different points on the substrate superficies. Finally, when streams of air are directed against the substrate to dry the fluid sprayed thereon, the substrate flutters, promoting uneven distribution of fluid on the substrate surfaces and promoting wrinkling of the substrate. Also, the interpenetrating disks interpel the air stream so that different rates of drying occur at different points on the planar substrate surfaces. These variances in the rates of drying further promote wrinkling of the substrate.

In order to prevent the substrate from fluttering during drying, some prior art apparatus, in an attempt to achieve a stasis, positions one air blower above and another opposing blower beneath the pliant substrate so that the siccative air streams from each blower are directed toward the same transverse line on the substrate. With this syntax, the forces from the two opposing air streams are supposed to offset one another and "pin" the paper in fixed position between the air streams. However, under actual operating conditions this result is not achieved. Air turbulence from the opposing streams still causes the complaisant substrate to flutter.

Accordingly, it would be highly desirable to provide improved apparatus for directing fluid streams against a pliant circuit board substrate such that a uniform coating would be formed on each of the planar substrate surfaces and such that puddling of fluids on and fluttering of the substrate during processing by the apparatus would be greatly minimized or eliminated.

Therefore, it is the principal object of the invention to provide improved apparatus for processing pliant circuit board substrate.

A further object of the invention is to provide improved circuit board substrate processing apparatus which will furnish planar substrate surfaces with integuments having uniform thickness.

Another object of the instant invention is to provide improved circuit board substrate processing apparatus which minimizes the formation of sinuate substrate and, consequently, minimizes puddling of fluid sprayed onto the upper surface of the substrate during processing by the apparatus.

Still another object of the invention is to provide improved circuit board substrate processing apparatus which minimizes or eliminates substrate fluttering while the substrate is contacted with pressurized siccative air streams.

These and other, further and more specific objects and advantages of the invention will be apparent to those skilled in the art from the following detailed description thereof, taken in conjunction with the drawings, in which:

FIG. 1 is a perspective view of conventional prior art apparatus utilized to process circuit board substrate;

FIG. 2 is a side view of the prior art apparatus of FIG. 1;

FIG. 3 is a perspective view of circuit board substrate processing apparatus constructed in accordance with one presently preferred embodiment of the invention;

FIG. 4 is a side elevation view of the pliant circuit board processing apparatus of FIG. 3;

FIG. 5 is a top sectional view of the circuit board processing apparatus of FIG. 4 taken along section line 5—5 thereof;

FIG. 6 is a side elevation view of another presently preferred embodiment of the circuit board substrate processing apparatus of the invention;

FIG. 7 is a perspective view of one of the blower units of FIG. 6 illustrating the segmented plenum thereof;

FIG. 8 is a side sectional view of the blower unit of FIG. 7 taken along section line 8—8 thereof and illustrating the side apertures formed at the mouth of the blower plenum; and FIG. 9 is a sectional view of the blower member of FIG. 7 taken along section line 9—9 thereof and further illustrating the interior construction thereof.

Briefly, in accordance with my invention, I provide improved apparatus for directing a stream of fluid against a substrate panel traveling through said apparatus, the panel having a pair of opposed generally parallel planar surfaces co-terminating at the edge defining the periphery of the panel.

The improved apparatus includes a conveyor table for transporting the substrate panel, the conveyor table including at least one rotary axle carrying a plurality of spaced circular rollers contacting the pliant substrate panel moving past the rollers; and at least one fluid flow unit generating a pressurized stream of fluid and having an elongate plenum including a plurality of elongate slots passing through the plenum and spaced therealong, and a mouth through which the pressurized stream of fluid passes from the fluid flow unit.

Each of the slots in the plenum are shaped, contoured and dimensioned to receive a portion of one of the circular rollers such that the roller can freely rotate while positioned in the slot and the mouth of the plenum can be positioned adjacent the substrate panel as the panel moves into contact with the roller.

Turning now to the drawings, which depict and presently preferred embodiments of the invention for the purpose of illustrating the practice thereof and not by way of limitation of the scope of the invention, and in which like reference characters represent corresponding elements throughout the several views, FIGS. 1 and 2 illustrate prior art apparatus including blower unit 11 directing fluid stream 12 against the upper planar surface 13 of rectilinear substrate 14 moving between disk rollers 15, 16 in the direction of travel indicated by arrow A. Disk rollers 15 are fixedly carried by parallel axles 17–22. The longitudinal axes of axles 17–22 are oriented perpendicular to the direction of travel A of rectilinear substrate 14. Each lower disk 16 has an opposing upper disk 15, both disks lying in the same vertical plane. Each lower axle 20–22 has an associated axle 17–19 positioned thereabove. Each pair of axles 17, 20; 18, 21; 19, 22 lie in a vertical plane and are positioned with respect to one another such that the upper and lower disk rollers 15, 16 carried on each axle pair form strictures and slightly pinch or frictionally contact circuit board substrate 14 traveling between upper and lower disks 15, 16 and assist in drawing the substrate between upper and lower disks 15, 16. Upper disks 15 are rotated by axles 17–19 in the direction indicated by arrows B in FIG. 2. Lower disks 16 rotate in the direction indicated by arrow C. In FIG. 1, axle 21 and disk rollers 16 carried by axle 21 were omitted for sake of clarity.

The apparatus of FIGS. 1 and 2 is suitable for directing fluid streams, i.e., streams of liquids or gases, toward renitant circuit board material. However, since substrate 14 is traveling over disk rollers 16, substrate 14 is not, at any given instant, completely supported at all points on lower planar surface 23 thereof. Consequently, if substrate 14 is pliable, when a stream 12 of coating liquid from blower 11 is directed against areas of substrate 14 not supported by disks 16, substrate 14 sheers and becomes sinuate as shown in FIG. 2, allowing puddles 24 of liquid to form. The surfeit of liquid in puddles 24 reduces the uniformity of the coating formed on substrate 14 when the liquid dries. Similarly, if stream 12 consists of an etching fluid, puddling of the fluid produces different rates of etching. When fluid stream 12 comprises air or another gas, directing stream 12 against portions of substrate 24 not supported by the edges 25 of disks 16 causes pliable substrate 14 to flutter. If an airstream 12 is being utilized to dessicate a coating liquid sprayed onto the surface of substrate 14, fluttering of the substrate causes the liquid to move about the surface of substrate 14 such that the dry coating formed on the substrate is of non-uniform thickness. Fluttering of wet substrate also tends to wrinkle the substrate and produce a dried coating which is veined with cracks.

Another problem associated with the apparatus of FIGS. 1 and 2 is that superincumbent vertiginous disks 15 interdict a liquid stream 12 emitted from blower 11 so that at any given instant in time a strigose pattern tends to be formed on upper surface 13 of substrate 14. The interdiction of a stream 12 of coating liquid by intercalated disks 15 promotes the formation of a non-uniform coating on surface 13. One of the presently preferred embodiments of the invention is shown in FIGS. 3–5 and includes blower units 31, 32 directing fluid streams against respective parallel planar surfaces 33, 34 of circuit board substrate 35 moving between upper disk rollers 36 and lower disk rollers 37 in the direction of travel indicated by arrows A. Parallel axles 38, 39, 41, 42, 44, 45 fixedly carry disk rollers 36, 37. Each disk roller 37 carried on axle 42 has a mate disk roller 36 carried on axle 38 and positioned directly above and in the same vertical plane as disk roller 37. Disk rollers on axles 44, 45 similarly each have mate disk rollers 37 on axles 39, 41. Disk roller pairs 36, 37 carried by axle pairs 38, 42; 39, 44 and 41, 45 are positioned such that when there is no substrate 35 moving through the apparatus the peripheral edges 46, 47 touch at their closest approach to one another. Floating axles 38, 39, 41 are mounted in the frame of the apparatus so axles 38, 39, 41 are readily upwardly displaced. If axles 38, 39, 41 are upwardly displaced, disks 36 carried thereon are also upwardly moved away from disks 37. Accordingly, when a sheet of circuit board substrate is fed into the apparatus of FIG. 3, the substrate upwardly displaces disk rollers 36 away from rollers 37 through a distance Z approximately equal to the thickness of the substrate sheet. Thus, each disk pair 36, 37 gently squeezes and frictionally contacts substrate 35 to draw substrate 35 in the direction of arrow D when axles 38, 39, 41, 42, 44, 45 rotate disk rollers 36, 37 in the directions indicated by arrows E and F, respectively. Although the substrate material is omitted from FIG. 3 for clarity, stacked disk pairs 36, 37 are shown in the positions they would occupy if substrate material having a thickness indicated by reference character Z were passing between disk pairs 36, 37. Elongate blowers 31, 32 include tapered plenums 48, 49 having mouths 50, 51 through which fluid streams emanate and contact substrate 35. Band rollers 52, 53 are fixedly carried by parallel axles 40 and 44. Axle 40 rotates in the direction indicated by arrow E while axle 52 rotates in the direction indicated by arrow F. For the sake of clarity, the drive motor and drive train utilized to rotate axles 38–45 and the frame supporting axles 38–45 and the drive train have been omitted from the drawings. Any conventional or other drive train system could be utilized to drive axles 38–45.

Cylindrical band surfaces 55 of rollers 52 carried by axle 43 form a substantially continuous cylindrical surface area. Cylindrical surfaces 56 of rollers 53 carried by axle 40 similarly form a substantially continuous cylindrical surface area. Each roller 52, 53 includes a pair of parallel circular faces 58, 59, respectively. Ricti G between adjacent parallel pairs of circular faces 58 of rollers 52 receive intercalated edges 47 of disk rollers 37. Similarly, interstices H between disks 47 intercatenated by axles 42, 44 receive isodiametric cylindrical rollers 52. The interpolating or interdigitizing of rollers 52 and disks 47 carried by axles 42, 44 prevents the leading edge of a thin pliable substrate moving through the apparatus from passing downwardly between rollers 52 and disks 42. The straight leading edge of substrate panel 35 is normally perpendicular to the direction of travel 35 indicated by arrows D in FIG. 4. Rollers 53 and disks 46 carried by axles 39, 41 are interdigitized or interproximated in a manner similar to that shown for rollers 52 and disks 47 carried on axles 42, 44 in FIG. 5.

As substrate 35 moves through the strictures between stacked disk pairs 46, 47 a stream of fluid (indicated by dashed lines X) from blower unit 31 travels downwardly against substrate 35 and presses substrate 35 against retral roller surfaces 55. As evidenced in FIGS. 3–5 (substrate 35 was omitted from FIGS. 3 and 5 for the sake of clarity), the stream of fluid X from blower 31 contacts surface 31 of substrate 35 along a strip transverse the direction of travel D of substrate 35. This elongate strip of substrate receives the major portion of the force generated against substrate 35 when fluid stream X from blower 31 contacts substrate 35. The elongate transverse substrate strip receiving the major portion of the force generated against the substrate by impinging fluid stream X is, at any given instant in time, supported by a substantially continuous strip of the cylindrical surface formed by cylindrical surface areas 55. Although axle 43 and rollers 52 could be stationary or rotated at different speeds than disk rollers 36, 37, the friction which would consequently be generated between stationary band rollers 52 and substrate 35 moving over the rollers normally makes it desirable to rotate rollers 52 at a speed comparable to the speed of rotation of the disk rollers 36, 37. If it were desired to have a stationary continuous elongate support surface positioned adjacent to and beneath substrate 35 when a fluid stream from blower 31 contacted substrate 35 along a strip transverse the direction of travel of substrate 35, the stationary support surface could, in contrast to the curved support surface of rollers 52, 53, comprise a flat elongate strip. When rollers 52 are utilized to form a substantially continuous elongate support surface which is transverse the direction of travel D of substrate 35, pliable substrate 35 tends to contour at any given instant in time over the strip of surfaces 55 supporting the transverse strip of substrate 35 being contacted by the rectangular fluid stream X from unit 31. A perfectly flat elongate support strip surface positioned adjacent and parallel to substrate 35 would have the advantage of eliminating contouring of the substrate 35 over a curved surface in reaction to the application of a fluid stream against the substrate and would instead allow the transverse strip of substrate 35 being contacted by a rectangular fluid stream X to remain perfectly flat while passing beneath blower 31.

The fluid stream X directed upwardly from rectangular blower mouth 51 against planar surfaces 34 of substrate 35 would press substrate 35 against the substantially continuous elongate support surface formed by cylindrical surfaces 60 of rollers 53 in a manner similar to that described above for blower 31 and cylindrical surfaces 55 of rollers 52. If desired, a stationary elongate flat support surface positioned parallel and adjacent to substrate 35 could be substituted for rollers 52.

Since blowers 31, 32 would both direct liquid streams against transverse strips of substrate substantially supported respectively by rollers 52, 53, the formation of sinuate substrate and the consequent puddling associated with the prior art apparatus of FIGS. 1 and 2 is avoided. When the fluid streams emanating from units 31, 32 are comprised of gas, the apparatus of FIGS. 3–5 minimizes or eliminates fluttering of thin, pliable substrate material traveling between disk pairs 36, 37.

Other presently preferred embodiments of the invention are depicted in FIGS. 6–9 and include upper and lower vertiginous disks 61, 62 rotatably carried by parallel axles 70–75, 80, 82. Band rollers 77, 79 are fixedly attached to and rotated by parallel axles 81, 83. Band rollers 77, 79 have the same shape, contour and dimensions as band rollers 52 and 53 in FIGS. 3–5, and disk rollers 61, 62 are shaped, dimensioned and spaced along axles 70–75, 80, 82 in a manner similar to disk rollers 36, 37 in FIGS. 3–5. If desired, band rollers 52, 53 can be formed without interstices G for interpolating disks 37 with rollers 52, 53. If this were done, rollers 52, 53 would have a continuous elongate cylindrical surface and axles 42, 44 and 41, 39 would have to be spaced further apart since disks 36, 37 could not be intercalated with rollers 52, 53.

In the apparatus of FIGS. 3–5 an axle of disk rollers was removed from the apparatus to permit the plenum 49 of blower 32 to be positioned between axles 44, 45. In the apparatus of FIGS. 6–9, the remotion of an axle of disk rollers is avoided by providing plenums 91 of blower units 84–89 with slots 90 which receive and fit over existing roller disks.

Rollers 61, 77 and axles 70–72, 80, 81 rotate in the direction indicated by arrow I. Rollers 62, 79 and axles 73–75, 82, 83 rotate in the direction indicated by arrow J. Substrate 65 moves between upper rollers 76, 61 and lower rollers 69, 62 in the direction of travel indicated by arrow K. Substrate 65 includes upper generally horizontal planar surface 66 and lower generally horizontal planar surface 67. Planar surfaces 66, 67 are opposed and parallel to one another and co-terminate at the edge defining the periphery of substrate 65.

As shown in FIGS. 7–9, side panels 92 of slots 90 do not extend fully down to the lower lips 93 of the mouths of plenums 91 and, accordingly, U-shaped slots 94 are formed which permit fluid streams indicated by arrows L to travel through slots 94 toward disks 76. The ability of fluid streams L to pass through slots 94 toward disks 76 assists in insuring that a fluid coating of uniform thickness is formed adjacent disks 76. If plenum 91 were not provided with slots 94, an insufficient amount of fluid would strike areas of substrate 65 immediately adjacent disks 76.

Blower unit 85 is pivotally connected at point 10 to the frame supporting axles 80–84 and 70–75 so that it can be rotated as indicated by arrows M. Remaining blower units 84, 86–89 are preferably pivotally mounted in a manner similar to blower unit 85.

Prior art apparatus sometimes utilizes opposing blower units positioned like blower units 88, 89 in FIG. 6 on the theory that the forces acting on substrate 65 from the opposing pressurized fluid streams contacting substrate 65 tend to offset each other and permit substrate 65 to pass between plenums 91 of units 88, 89 without being deflected from substrate 65's horizontal rectilinear line of travel. However in practice, turbulence resulting after fluid streams from units 88, 89 have contacted and been deflected from substrate 65 result in turbulence which causes pliant substrate 65 to flutter. Fluttering of substrate 65 can wrinkle the substrate and produce coatings having nonuniform thickness.

Angling elongate plenums 91 of blower units 84, 54 slightly from the vertical such that fluid streams directed through mouths 93 toward substrate 65 contact substrate 65 slightly ahead of or behind the point of closest approach of circumferential edges 98, 99 of stacked pairs 76, 78 of opposed roller disks lying in imaginary vertical planes minimizes fluttering because substrate 65 tends to be maintained in fixed position by opposed disk pairs 76, 78. In addition, the turbulence occurring near substrate 65 in areas 100 to the right of plenum mouths 93 of units 84, 85 tends to be minimized since the right hand sides of mouths 93 are tilted near to substrate 65 and the proportion of fluid streams Y passing into areas 100 is minimal. The effect on substrate 65 of fluid stream turbulence in areas 101 to the left of mouths 93 of plenums 91 is minimized because disk edges 98, 99 hold substrate 65 in position. The passage of pressurized fluid streams Y from mouths 93 of plenums 91 tends to create low pressure areas outside and near mouths 93 of plenums 91. These low pressure areas apparently promote turbulence and, consequently, fluttering of pliant substrate 65. Tilting plenums 91 and mouths 93 of units 84, 85 as shown in FIG. 6 also seems to minimize the effectiveness of such low pressure areas in causing turbulence.

The roller-blower unit arrangement which presently appears to best support substrate 65 when fluid streams are directed thereagainst is depicted by blower units 86, 87 and band rollers 77, 79 in FIG. 6. Blower unit pairs 84, 85 and 88, 89 each essentially direct a fluid stream toward one another. If mouths 93 of a pair of blowers are offset from one another like mouths 93 of blower units 86, 87 and the airstream from each blower interacts with a separate group of rollers, scilicet, with a separate pair of parallel axles lying in a vertical plane—as, for instance, blower 86 interacts with stacked axles 70, 83 and rollers 79, 61; and blower 87 interacts with parallel opposed axles 73, 81 and rollers 62, 77—then fluttering of substrate 65 is greatly minimized. Band rollers 77, 79 provide substantial support for the transverse band of substrate being sprayed at any given moment as the substrate travels between the conveyor rollers, while slightly angling plenums 91 from the vertical apparently also reduces the amount of turbulence resulting during spraying or drying of substrate 65. The ideal position of mouths 93 of plenums 91, both in terms of the ideal horizontal distance of the elongate center lines Z of mouths 93 from the point of closest approach of edges 98, 99 of disk pairs 61, 62 and, in terms of the angle of plenums 91 from the vertical, will depend on the weight and other characteristics of substrate 65.

In FIGS. 3–9, the mouths of blower units used to direct fluid streams against substrate are positioned closely adjacent the substrate in order to minimize the divergence of the fluid streams prior to their contacting substrate 65 and to thus insure that the fluid streams emitted from the mouths of the units principally strike a transverse strip of substrate substantially supported by a band roller positioned subadjacent the substrate and transverse the direction of travel of the substrate. However, spray nozzles exist which emit a fluid stream in a thin sheet. This type of nozzle could, for example, be used in place of blower unit 86 in FIG. 6 and be positioned above rollers 61 in a manner similar to blower 11 in FIG. 2. The mouth of the nozzle would be oriented such that fluid from the nozzle would generally only contact surface 66 of substrate 65 along a transverse strip substantially supported by band roller 79. Blower units 84, 85, 87–89 could similarly be replaced by spray nozzles each emitting a sheet of fluid which would only contact substrate 65 along a strip transverse the direction of travel of substrate 65. In practicing the invention, it is of primary importance to utilize some means to direct fluid streams only against transverse strips of substrate substantially supported by band rollers such as rollers 77, 79 (FIG. 7) and rollers 52, 53 (FIG. 3).

Although the apparatus of the invention could be utilized to process rigid circuit board substrate panels or pliant substrate panels only comprised of sheets of paper, metal foil or other materials, the substrate panel material presently processed with the apparatus in a thin, pliant cooper coated sheet of synthetic material such as Kapton or Mylar. The copper coating is formed on the synthetic material by autocatalytic electroless plating or other known plating processes.

During a typical circuit board substrate treatment process an etchant resistant conductor pattern is formed photographically. The copper layer on the Kapton or Mylar synthetic is coated with photosensitive emulsion. A photographic negative of the circuit pattern is then superimposed on the emulsion and exposed to ultraviolet light. During this ultraviolet light exposure the emulsion subjected to ultraviolet light hardens. The copper-synthetic substrate is then placed in a chemical bath to dissolve and depurate the unexposed emulsion from the copper foil. The hardened exposed emulsion areas are not dissolved, and serve to interpel dissolution of areas of copper foil during the subsequent etching process. The copper not covered with hardened emulsion is then dissolved in a chemical etchant bath. Finally, the hardened emulsion is dissolved from the exposed areas, leaving the copper conductor pattern on the synthetic material.

The above circuit board substrate treatment process can be facilitated by the apparatus of the invention. For instance, after portions of the photosensitive emulsion have been exposed to ultraviolet light, the unexposed portion of the emulsion can be dissolved by inserting the copper-synthetic substrate in the apparatus of FIG. 7. Blower units 86, 87 could, assuming copper coating was on both surfaces 66, 67 of substrate 65, be utilized to spray chemistry on the substrate to dissolve unexposed emulsion areas from the substrate. Another pair of blower units would probably be positioned downstream to dry surfaces 66, 67 after they had been sprayed with chemistry. Similarly, blower units coulld be utilized to direct streams of etchant against copper areas exposed after unexposed emulsion is dissolved therefrom with development chemistry.

As earlier noted, in FIGS. 3-9 blowers 31, 32, 84-89 direct pressurized streams of fluid generally toward the points where the circuit board substrate contacts and is supported by band or disk rollers. The pressurized fluid streams may comprise a gas, a gas carrying vaporized liquid, a gas carrying droplets of liquid or a liquid stream. When a pressurized stream of liquid is being directed against substrate flowing through the apparatus, spray bars similar to bar 110 in FIGS. 3, 6 may be utilized. Nozzles 112 of bar 110 direct fan shaped spray streams 111 against substrate moving through the apparatus.

In FIGS. 3, 4 each disk roller 36 is positioned directly above a corresponding disk roller 37 so that each disk roller pair 36, 37 lies in an imaginary vertical plane and the center points of each disk 36, 37 comprising the pair lie along a single imaginary vertical line. This conventional arrangement of disk roller pairs is generally acceptable for substrate sheets which are thicker than 4 mils; however, stacked disk roller pairs are not generally acceptable to substrate sheets having thicknesses of 4 mils or less. During operation of the apparatus of FIG. 3, 4 edges 46, 47 of stacked disk pairs 36, 37 tend to be laterally displaced with respect to one another and to cause a shearing force to be applied to substrate sheet material passing between the disk pairs. When the sheet material has a thickness of 4 mils or less, this shear force can deform or crease the sheet material. Shearing of substrate sheet material by disk roller pairs can be remedied by not positioning each disk 37 immediately beneath a disk 36. Instead, as indicated by dashed lines 114 in FIG. 3, disks 37 are laterally moved along the axle carrying the disks so that each disk 36, 37 carried on an axle pair—for instance axles 41, 45 lying in a single imaginary vertical plane—actually lies in a separate imaginary vertical plane. Accordingly, then substrate sheet material having a thickness of 4 mils or less is fed into the apparatus, disks 36 on axle 41 are positioned as indicated in FIG. 3 and each disk 37 on axle 45 is moved along the axle to one of the positions indicated by dashed lines 114. Similar lateral adjustments would be made for disks 37 carried on axles 42 and 44.

In FIG. 6, point Q lies in the imaginary vertical plane passing through the horizontal centerlines of axles 73, 81 and lies in the horizontal plane defined by the upper surface 66 of substrate 65. Blower 87 directs a pressurized fluid stream to the left of point Q toward the "upward side", i.e., the side traveling toward substrate 66, of the circumferential cylindrical surface of roller 77. Plenum 91 of pressurized fluid blower 87 is sloped so the vector V representing the velocity of fluid traveling through the plenum toward substrate 65 includes a horizontal component $V_H$ and vertical component $V_V$. The horizontal component $V_H$ is directed in the direction of travel K of substrate 65 and assists the movement of substrate 65 through the rollers. As shown by liquid stream 111 from nozzle 112, a pressurized sloped stream of fluid can be directed to the right of point Q against the "downward side", i.e., the side traveling away from substrate 65, of the cylindrical circumferential surface of roller 77. Stream 111 would have a horizontal velocity vector component $V_H$ directed against the direction of travel K of substrate 65 and would tend to impede movement of substrate 65 in direction K. Although it is preferred to have the fluid streams directed against substrate sloped such that the horizontal velocity $V_H$ is in the direction of travel K of substrate 65 through the rollers, the fluid stream can, as is the case with stream 111 in FIG. 6, be sloped so velocity vector $V_H$ is directed against the direction of travel of substrate 65 as long as the fluid stream 111 is directed toward the downward side of a roller. Directing stream 111 toward the upward side of roller 77 or directing plenum 91 toward the downward side of roller 77 is not desirable, especially with substrate sheets less than 4 mils thick. Similarly, directing fluid streams X perpendicular to the substrate as illustrated in FIG. 4 is often not desirable for thin sheets of substrate material. Angling the fluid streams away from the vertical and directing the streams toward the upward or downward side of the surface of the rollers as do units 84-87, 111 in FIG. 6 produces the best results.

In prior art apparatus (FIG. 2) fluid blowers are positioned above (or below) interdigitized disks 15 (or 16) and pressurized streams of fluid 12 emitted from blowers 11 have to travel in between disks 15 (or 16) to reach the surface(s) of substrate 14. As a result, when blowers 11 direct a stream of air toward wet substrate 14, disks 15 prevent the air stream from reaching the sections of substrate 14 situated immediately beneath the circumferential edges of disks 15. These sections of substrate do not properly dry and streaks or water bubbles form on the substrate. Constructing the blowers as shown in FIGS. 7-9 eliminates this problem. Slots 90 formed in plenum 91 receive spaced disks 61 (or 62) carried along a particular rotary axle and enable mouth 93 of blower unit 84 to be positioned adjacent substrate 65 as depicted in FIG. 6. Positioning the mouth of plenum 91 adjacent substrate 65 permits all points on the substrate surface to be dried at a more uniform rate. Slots 94 are formed in each of the vertical walls 92 of slots 90. Slots 94 permit air, indicated by arrows L in FIG. 9, to travel toward and dry substrate 65 at the points where disks 61 have contacted or will contact substrate 65. If slots 94 are not formed in walls 92, streaks and water bubbles still tend to form on the surface of substrate 65.

The dimensions of a presently preferred embodiment of the invention are shown in FIGS. 7-9 and include distance P equal to 2.000 inches, distances Q equal to 2.000 inches, distance R equal to 0.125 inches, distance S equal to 0.375 inches, distance T equal to 1.687 inches, and distance U equal to 3.187 inches.

In the drawings the apparatus of the invention is depicted applying fluid to substrate being transported along generally horizontally disposed conveyor units. As would be appreciated by those of skill in the art, the apparatus of the invention could be utilized to apply fluid to substrate moving along sloped or even vertically oriented conveyor units. Applying liquids to substrate which was being transported so that the generally parallel planar surfaces of the substrate were vertically oriented could be advantageous since the force of gravity would tend to cause excess fluid to flow downwardly off of sprayed sections of substrate.

Having described the invention in such terms as to enable those skilled in the art to which it pertains to understand and practice it, and having described the presently preferred embodiments thereof, I claim:

1. Apparatus for directing a stream of fluid against a substrate panel traveling through said apparatus in a selected direction of travel, said panel having a pair of opposed generally parallel planar surfaces coterminating at the edge defining the periphery of said panel, said apparatus including
   (a) a conveyor table for transporting said substrate panel in said direction of travel, said conveyor table including at least one rotary axle carrying a plurality of spaced circular rollers contacting said pliant substrate panel moving past said rollers;
   (b) at least one fluid flow unit generating a pressurized stream of fluid and having an elongate plenum with a longitudinal axis transverse said direction of travel of said substrate, said elongate plenum including
      (i) an upper portion,
      (ii) a lower portion,
      (iii) a plurality of spaced elongate slots passing transversely through said lower portion of said plenum with respect to said longitudinal axis, and
      (iv) a mouth formed in said lower portion of said plenum, said pressurized stream of fluid passing through said mouth to leave said fluid flow unit,
   each of said slots being shaped, contoured and dimensioned to continually receive and permit portions of one of said rotating circular rollers to pass therethrough such that
      (v) the one of said portions of said roller positioned in and rotating through said slot at a particular time is able to move freely therein, and
      (vi) said mouth of said plenum is positioned generally adjacent said substrate panel as said panel moves into contact with said roller.

* * * * *